(12) United States Patent
Baumgartner et al.

(10) Patent No.: US 12,520,441 B2
(45) Date of Patent: Jan. 6, 2026

(54) ELECTRONICS HOUSING

(71) Applicant: Endress+Hauser Conducta GmbH+Co. KG, Gerlingen (DE)

(72) Inventors: Thomas Baumgartner, Stuttgart (DE); Axel Vierkötter, Renningen (DE); Konstantinos Diplas, Waiblingen (DE); Christian Felcmann, Mühlacker (DE)

(73) Assignee: Endress+Hauser Conducta GmbH+Co. KG, Gerlingen (DE)

(*) Notice: Subject to any disclaimer, the term of this patent is extended or adjusted under 35 U.S.C. 154(b) by 167 days.

(21) Appl. No.: 18/537,340

(22) Filed: Dec. 12, 2023

(65) Prior Publication Data
US 2024/0206094 A1    Jun. 20, 2024

(30) Foreign Application Priority Data
Dec. 19, 2022  (DE) ............. 10 2022 133 926.2

(51) Int. Cl.
*H05K 5/02* (2006.01)
*H01R 13/633* (2006.01)

(52) U.S. Cl.
CPC ......... *H05K 5/0247* (2013.01); *H01R 13/633* (2013.01)

(58) Field of Classification Search
None
See application file for complete search history.

(56) References Cited

U.S. PATENT DOCUMENTS

| | | | | |
|---|---|---|---|---|
| 5,989,042 A * | 11/1999 | Johnson | ........... | H01R 13/639 439/131 |
| 6,537,085 B2 * | 3/2003 | Na | ........... | H01R 12/725 439/564 |
| 7,407,402 B1 * | 8/2008 | Peng | ........... | H01R 13/6335 439/352 |
| 8,353,715 B1 | 1/2013 | Zhou | | |
| 8,512,062 B1 * | 8/2013 | Zhou | ........... | H01R 13/635 439/352 |
| 8,801,452 B2 * | 8/2014 | Wang | ........... | H01R 13/633 439/352 |
| 2012/0108088 A1 * | 5/2012 | Peng | ........... | H01R 13/5213 439/135 |
| 2021/0036462 A1 * | 2/2021 | Zhai | ........... | H01R 24/62 |

OTHER PUBLICATIONS

Gigaset, A170/A170A A270/270A, Die aktuellste Bedienungsanleitung finden Sie unter, Gigaset Communications GmbH, www.gigaset.com/manuals, 44 pp.

* cited by examiner

*Primary Examiner* — Xanthia C Relford
(74) *Attorney, Agent, or Firm* — Mark A. Logan; Endress+Hauser (USA) Holding, Inc.

(57) ABSTRACT

An electronics housing comprises a housing cover and/or a housing body for delimiting a receiving space, and an electronics module arranged therein, wherein the electronics module has a plug connector socket accessible from outside the electronics housing for receiving a plug connector plug of a data cable, wherein the electronics housing has a pull tab integrated into the plug connector socket or upstream of the plug connector socket on the outside, for releasing the plug connector latched connection between the plug connector socket and the plug connector when the pull tab is pulled.

11 Claims, 4 Drawing Sheets

ELECTRONICS HOUSING

CROSS-REFERENCE TO RELATED APPLICATION

The present application is related to and claims the priority benefit of German Patent Application No. 10 2022 133 926.2, filed on Dec. 19, 2022, the entire contents of which are incorporated herein by reference.

TECHNICAL FIELD

The present disclosure relates to an electronics housing having a plug connector socket which is accessible outside the housing.

BACKGROUND

Generic electronics housings are known from the prior art, wherein a plug connector must always be inserted into a plug connector socket in such a way that a retaining latch of the plug connector is accessible from the outside.

Unintentional pressure on the retaining latch can lead to unlatching, and thus to a defective contacting of the data cable to the plug connector socket. If the electronics housing is already installed and a fault in the data connection is detected, it may be quite complicated to re-establish the contacting, depending on the installation location.

Furthermore, the housing cannot be placed flat onto a mounting surface, since the retaining latch is usually in the way. If the plug connector is arranged in a housing recess, the advantage of easy accessibility of the retaining latch becomes increasingly difficult. For decoupling, the retaining latch must be pressed and the cable must be pulled simultaneously.

Given certain alignments of the plug connector socket in the electronics housing, the conventional retaining latch of the plug connector thus has disadvantages for the installation of the data cable and the arrangement of the electronics housing at the installation site, and increases the risk of unintentional decoupling of the plug connection.

SUMMARY

Proceeding from this preliminary view, the object of the present disclosure is to provide an electronics housing which at least reduces or completely avoids the aforementioned problems.

The present disclosure solves this problem with an electronics housing having the features of claim 1.

The electronics housing according to the present disclosure comprises a housing cover and/or a housing body. The housing cover and the housing body can jointly form a receiving space for an electronics module.

The receiving space can be formed from only the aforementioned two housing components, or also from more than the two housing components. The delimitation of the receiving space in this case merely means that the housing cover and/or the housing body provide a wall portion which delimits the receiving space. Other further wall portions for delimiting the receiving space can also be provided by other housing components.

A seal arranged between the housing cover and the housing body, e.g. an annular seal, in particular made of elastomer material, can seal the connection of both housing components against fine dust, and in particular penetrating air moisture.

Furthermore, the electronics module is a further part of the electronics housing, arranged therein. The electronics housing according to the present disclosure is thus filled with corresponding electronics.

The electronics module has a plug connector socket accessible from outside the electronics housing for receiving a plug connector of a data cable. This can be connected, for example, to further electronics components of the electronics module via a printed circuit board located in the receiving space, or a cable connection.

In order that the plug connector socket is accessible from the outside, the housing cover and/or the housing body has a passage, preferably matched to the plug connector socket.

The so-called plug face of the plug connector socket points in the direction of the housing outer region in order to be brought into contact with a corresponding plug connector.

According to the present disclosure, the electronics housing has a pull tab integrated in the plug connector socket, or upstream of the plug connector socket on the outside thereof.

The pull tab serves to release, in particular unlatch, a plug connector latched connection between the socket and a corresponding plug. This takes place by pulling on the pull tab. The retaining latch of a plug connector can accordingly be installed in a concealed manner, thereby preventing an unintentional unlatching when the latching tab is touched. At the same time, the overall height of the electronics housing can be reduced, and the side with the plug connector socket can be placed flat on an installation surface without the retaining latch deforming during installation and triggering an unlatching of the plug connection.

Other advantageous embodiments of the present disclosure are the subject matter of the dependent claims.

The housing cover and/or the housing body can have a cable guide shaft which is accessible from outside the electronics housing, wherein the plug connector socket adjoins the cable guide shaft at the end, and wherein the pull tab is arranged in the cable guide shaft or is part of the cable guide shaft.

The cable guide shaft serves to guide a portion of a data cable to the plug connector designed to correspond to the plug connector socket. The data cable is not arranged and guided completely in the shaft, but only in regions in the shaft. It is thus possible, for example, for the plug to be arranged in the shaft with a small length of the cable attachment arranged thereon.

If the pull tab is part of the cable guide shaft, it can advantageously be arranged at the same height or recessed relative to a shaft base of the cable guide shaft.

The pull tab is elastically deformable, preferably resiliently, on the housing. As a result, the pull tab can press against an actuating mechanism on the plug connector, in particular a retaining latch, deforming when tensile forces are applied.

The pull tab is advantageously U-shaped, wherein a central segment of the U-shaped contour of the pull tab runs parallel or coaxially with the shaft base of the cable guide shaft. With a parallel alignment, a recessed arrangement of the central segment relative to the shaft base is preferred.

The pull tab can advantageously be spaced apart on the edge from the remaining electronics housing. As a result, the pull tab has a high flexibility for deformation.

Furthermore, the pull tab can be fixed at the end of the housing cover or housing body, in particular at the edge of the cable guide shaft.

The pull tab can have a terminal actuating projection which facilitates operability of the pull tab.

Advantageously, the pull tab can terminate flush with the opening of the cable guide shaft in the housing cover or housing body. On the one hand, this enables good accessibility of the pull tab for manual operation and, on the other hand, the pull tab does not represent an obstacle during the planar installation. At the same time, the pull tab is not inadvertently pressed and thereby damaged.

The electronics housing according to the present disclosure can optionally also comprise the aforementioned data connection cable with the plug connector. It thus is an embodiment variant of a housing with an integrated cable, wherein the cable is detachably arranged on the housing.

For this purpose, the plug connector can have a retaining latch. The data cable is anchored to the housing cover or the housing body in such a way that the retaining latch is arranged terminally in a groove located in the cable guide shaft. The groove thus constitutes a depression relative to the cable guide shaft. The terminal arrangement of the retaining latch in the groove prevents a linear displacement between the plug connector and the plug connector socket, and thereby enables an additional securing of the plug connection of the two components. In addition to the above-described securing of the plug connection, a latching with the plug connector socket or other components of the electronics housing can also take place at another location of the retaining latch, for example in the central region of the retaining latch. Corresponding latching systems have been sufficiently known for many years from RJ plug connector technology or Ethernet plug connector technology.

The groove depth of the groove in the cable guide shaft can be variable by mechanical deformation of the pull tab. The pull tab forms a region, in particular the base region, of the groove.

The pull tab and the retaining latch can advantageously be arranged relative to one another in such a way that the retaining latch can be deformed and thus unlatched by the application of force perpendicular to the insertion direction of the plug connector into the plug connector socket.

The cable guide shaft can have an arcuate extension in the housing cover or housing body for strain relief. This contributes to strain relief of the connected cable.

The actuating projection can furthermore advantageously be dimensioned such that it allows manual, tool-free engagement in the latched state of the cable. Advantageously, said projection should enable manual engagement of the actuating projection to exert a tensile force.

A particularly advantageous compromise between elasticity and mechanical stability results if at least the pull tab and preferably the entire housing cover and/or housing body with the pull tab attached thereto is formed of polycarbonate.

BRIEF DESCRIPTION OF THE DRAWINGS

The electronics housing according to the present disclosure is explained in more detail below with reference to an embodiment. In the figures.

DETAILED DESCRIPTION

Figure 1:
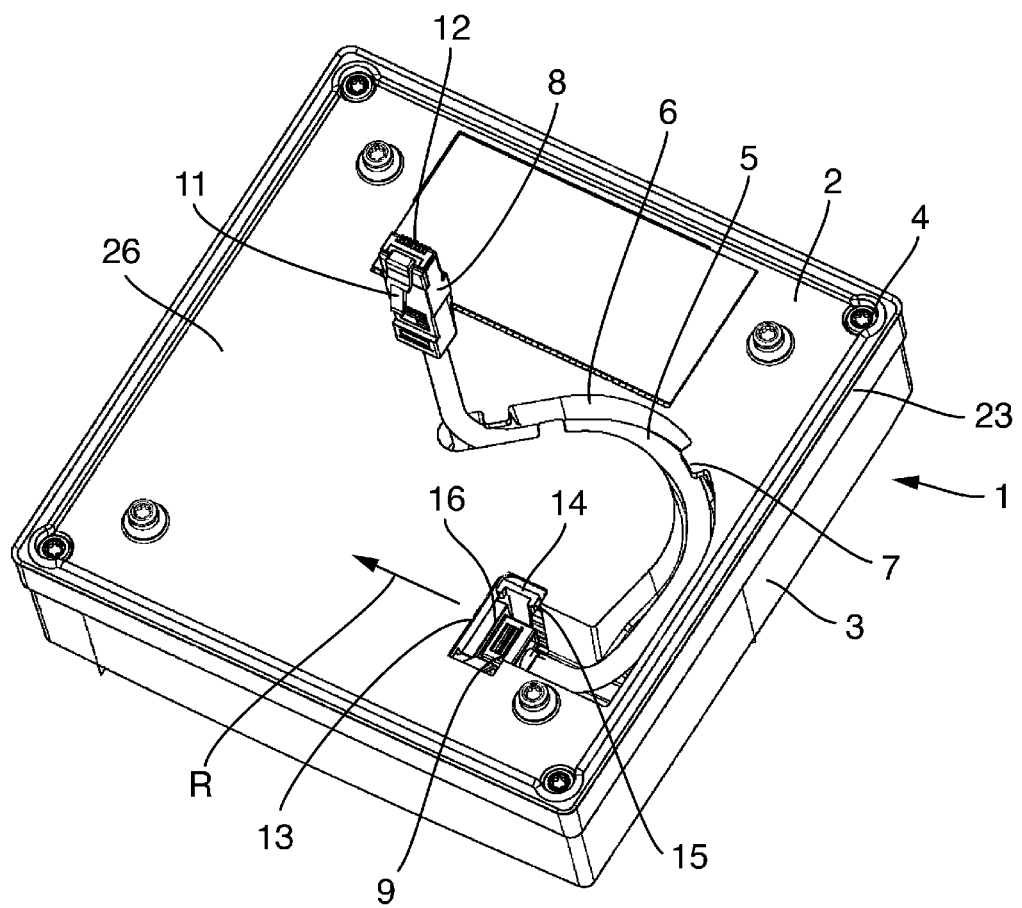
FIG. 1 shows a schematic perspective view of an electronics housing according to the present disclosure with inserted data cable.

FIG. 1 shows an electronics housing 1 with at least one electronics module arranged therein. The electronics housing 1 has a housing cover 2 and a housing body 3 which are connected to one another via a seal 23 and which delimit a receiving space 10 for receiving an electronics module 27. The housing cover 2 and the housing body 3, and optionally also the seal 23, can preferably be connected, in particular screwed, to one another via mechanical connecting means, in particular screws 4. Furthermore, the electronics housing 1 can have a cable 5, in particular a data cable, which, in one embodiment of the present disclosure, can be a component of the electronics housing 1.

In a further example, however, the electronics housing 1 without said cable 5 is also an embodiment variant according to the present disclosure.

The electronics module 27 comprises a plug connector socket 13 having an insertion opening 16 for inserting a plug connector 9 of a cable 5, in particular a data cable, into the socket. The cable 5 of FIGS. 1, 3 and 4 has two identically designed plug connectors 8 and 9. The following description of the plug connector 8 is therefore also applicable analogously to the plug connector 9, and vice versa. However, it is also possible for the plug connectors of the cable 5 to be designed differently.

In a manner known per se, the plug connector socket 13 has contact elements which are designed to contact corresponding contact elements 12 of the plug connector 9. The plug connector socket 13 defines an elongated cavity in which the plug connector 9 can be inserted in the insertion direction R.

The insertion direction R extends parallel to a cover plane of the housing cover 2, base plane of the housing body 3, and/or a closure plane which is defined by the seal 23.

Preferably, the housing cover 2 and/or the housing body 3 has a flat plate segment 26 which preferably extends over more than 90% of the width and/or length of the housing.

The housing cover 2 and/or the housing body 3 preferably have a, preferably curved, cable guide shaft 6 with a shaft base in which the cable 5 rests at least in regions. As with a channel, the cable guide shaft 6 is designed to be open on one side. As a result, the cable 5 does not protrude relative to the rest of the housing surface, and thereby enables a flat contact of the electronics housing 1 on an installation surface. The cable guide shaft 6 only accommodates a part of the cable, or even the part of the plug 8, 9 with a cable attachment.

Projections 7 projecting into the cable guide shaft 6 prevent the cable 5 from being pushed out of said shaft. The cable guide shaft opens into the plug connector socket 13 at the end. Analogously to the plug connector 8, the plug connector 9 also has a retaining latch 11 which protrudes at an angle from the contour of the plug connector 9. The plug connector 9 is arranged in the manner of a box, and in turn has a longitudinal axis. When the plug connector 9 is inserted, it is arranged coaxially with the insertion direction R. Axial pressure on the retaining latch 11 presses the retaining latch radially in the direction of the longitudinal axis, and elastically deforms it.

A plug connector can typically be unlatched from a plug connector socket in this way and removed from the insertion position. However, as visible in FIG. 1, the retaining latch 11 of the plug connector 9 is arranged in the electronics housing 1 inaccessible from the outside. In the latched position, the retaining latch 11 protrudes in the direction of the shaft base of the cable guide shaft 6, so that the retaining latch 11 is covered by the contour of the plug connector 9.

For the unlatching of the plug connector 9, the cable guide shaft 6 and/or the plug connector socket 13 have a pull tab 14 which, when pulled in the region of the shaft base of the cable guide shaft 6, presses on the retaining latch 11 and thus brings about an unlatching.

The pull tab 14 has a terminal actuating projection 15, which can be gripped by means of fingers or a fingernail or another suitable element and can be actuated with a pull away from the housing 1.

Figure 2:
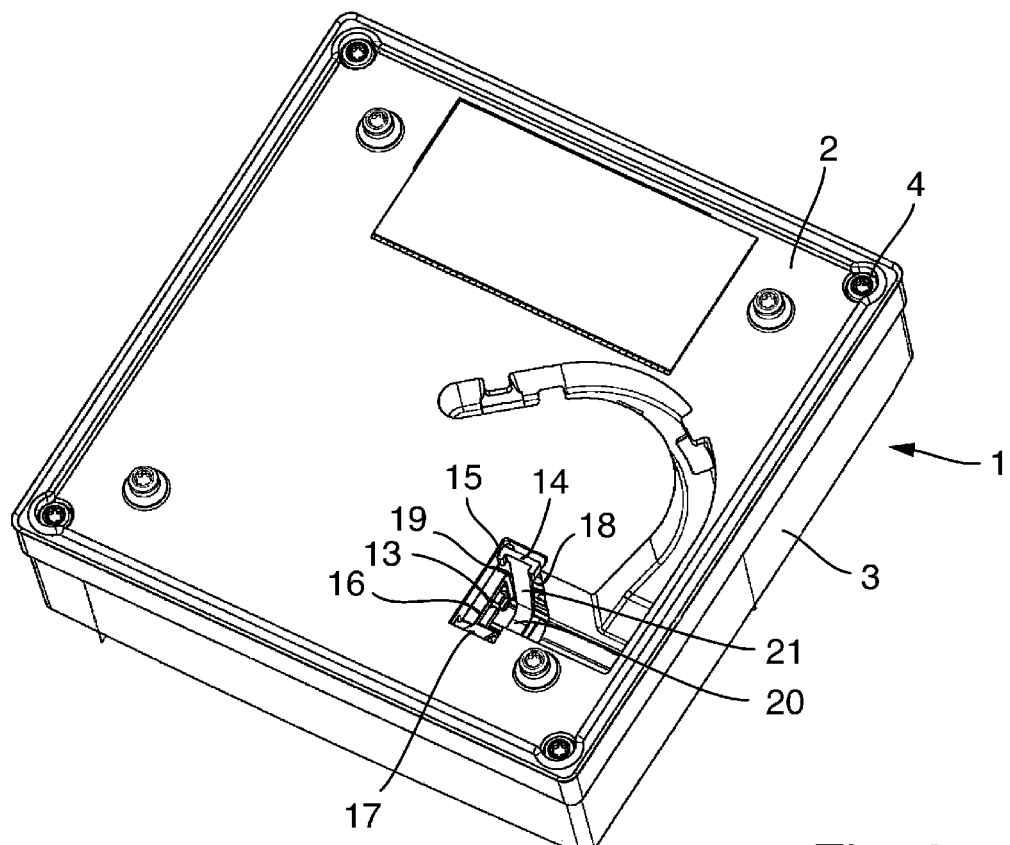
FIG. 2 shows a schematic perspective view of the electronics housing without inserted data cable.

FIG. 2 shows the electronics housing 1 without cable 5. The pull tab 14 can be seen more clearly here. It has a U-shaped contour. In the installed state of the cable 5 and/or during the unlatching, the retaining latch 11 rests on the central segment 20 between the limbs 21 of the "U".

It is preferably spaced apart from the adjacent regions of the cable guide shaft 6 and/or from the plug connector socket 13 by slots 18 and 19 so that the pull tab is elastically deformable compared to the adjacent elements of the housing 1 when a tensile force is applied.

The pull tab 14 is connected on one end to the housing. This connection 17 is preferably a material bond. Particularly preferably, the pull tab 14 is made of the same material as the housing cover 2 and/or the housing body 3 on which it is fixed.

A preferred material for ensuring a break-free elastic deformation is a polycarbonate. The pull tab 14 can extend over a region of less than 2 cm, preferably less than 1 cm, in the cable guide shaft 6.

The pull tab 14 is preferably upstream of the plug connector socket 13 and is preferably spaced apart therefrom less than 3 cm, preferably less than 1 cm, particularly preferably less than 0.5 cm. This enables a central force transmission through the pull tab onto the retaining latch 11.

Figure 3:
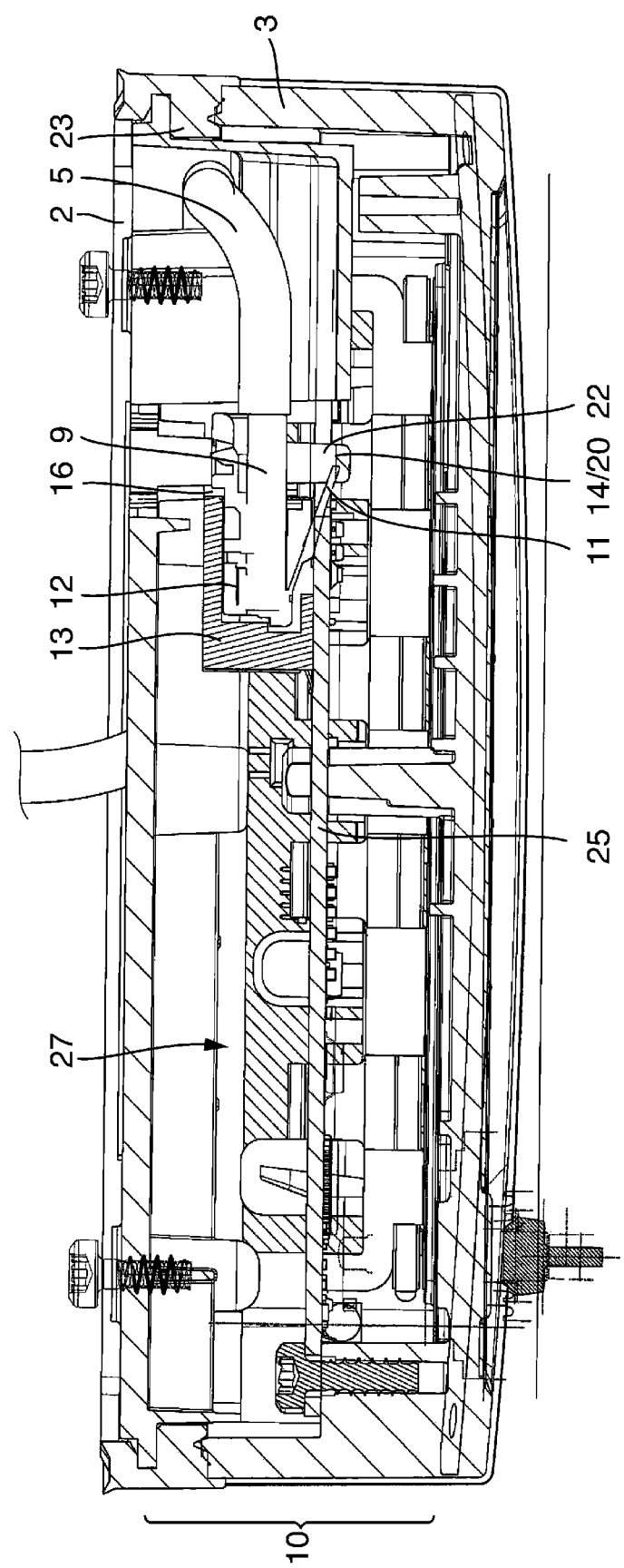
FIG. 3 shows a cutaway side view of the electronics housing of FIGS. 1 and 2.

FIG. 3 shows a sectional view of the plug connection made of the plug connector socket 13 and the plug connector 9. The plug connector socket 13 is connected to a printed circuit board 25 for the exchange and forwarding of data to further electronics components. As can be seen in this figure, the retaining latch plunges at its end into a groove 22, as the latching means corresponding to the retaining latch 11. This combination of groove 22 and retaining latch 11 limits the movement of the plug connector 9 against the direction of insertion R.

The central segment 20 of the pull tab 14 is also arranged in the groove 22. The depth of the groove 22 can be varied by deformation of the pull tab 14. By pulling on the pull tab, the groove depth of the groove 22 decreases, so that an unlatching occurs.

Figure 4:
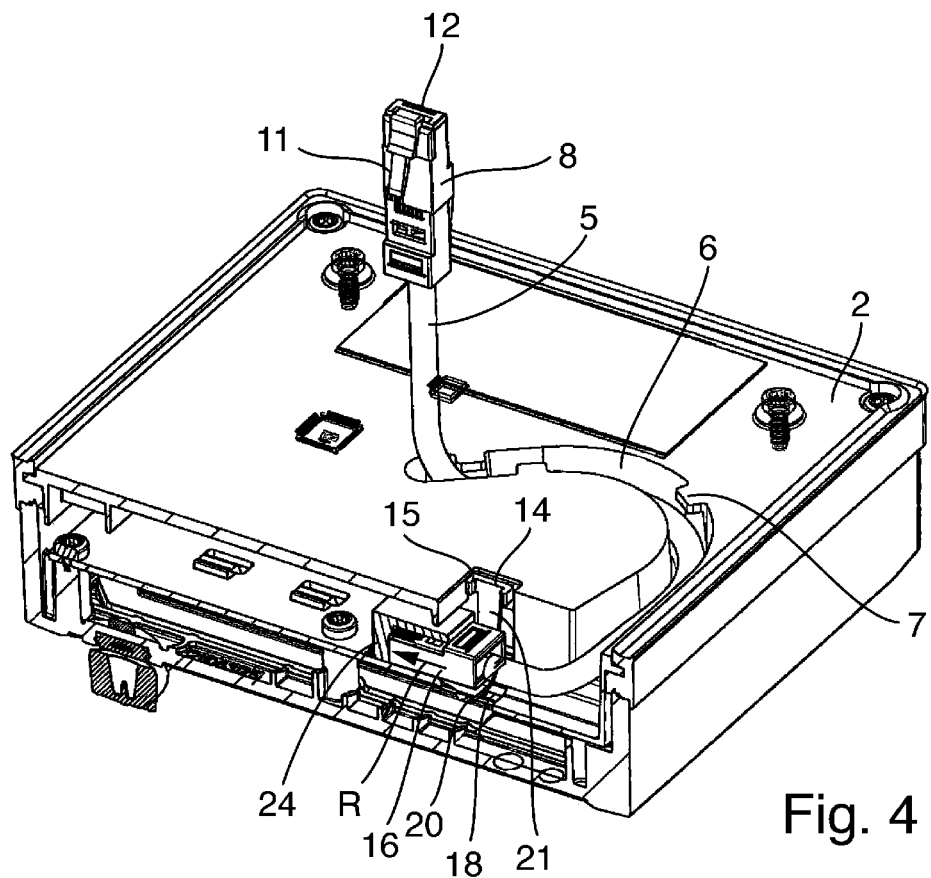
FIG. 4 shows a cutaway perspective view of the electronics housing of FIG. 1-3.

FIG. 4 shows a further cutaway view to illustrate the latching and the possibility of unlatching by the pull tab 14. The plug connector 9 is connected to the plug connector socket 13 via a data interface 24, and thus enables a data exchange.

A modular plug connection, in particular a so-called RJ plug, can preferably be used as a preferred plug connector 9, but other plug connector types can also be contemplated.

It is particularly advantageous if the pull tab 14 terminates flush with the housing cover 2 or the housing body 3 or below the opening of the cable guide shaft 6. As a result, the housing cover 2 or the housing body 3 can be placed flat on a surface and installed. In this case, protruding components are not present. No accidental unlatching can occur during the installation of the electronics housing 1 according to the present disclosure.

The latching and unlatching, in particular for a flush arrangement with the housing cover 2 or the housing body 3, can be performed by manual operation of the actuating projection 15 without the use of additional tools. This simple operability is a further special advantage of the electronics housing according to the present disclosure.

The invention claimed is:

1. An electronics housing, comprising:
   a housing cover and/or a housing body for delimiting a receiving space; and
   an electronics module arranged in the receiving space, wherein the electronics module includes a plug connector socket accessible from outside the electronics housing for receiving a plug connector of a data cable,
   wherein the electronics housing has a pull tab integrated into the plug connector socket or upstream of the plug connector socket on the outside, for releasing the plug connector latched connection between the plug connector socket and the plug connector when the pull tab is pulled,
   wherein the housing cover and/or the housing body has a cable guide shaft which is accessible from outside the electronics housing, wherein the plug connector socket adjoins the cable guide shaft at the end and wherein the pull tab is arranged in the cable guide shaft or is part of the cable guide shaft, and
   wherein the electronics housing has the data cable with the plug connector, wherein the plug connector has a retaining latch, and wherein the data cable is anchored to the housing cover or the housing body in such a manner that the retaining latch is arranged on one end in a groove located in the cable guide shaft.

2. The electronics housing according to claim 1, wherein the pull tab is fixed to the housing cover and/or housing body in an elastically deformable, resilient, manner.

3. The electronics housing according to claim 1, wherein the pull tab is U-shaped, wherein a central segment of the U-shaped contour of the pull tab runs parallel or coaxially with the base of the cable guide shaft.

4. The electronics housing according to claim 1, wherein the pull tab is spaced apart on an edge from the rest of the electronics housing by slots and is fixed on end thereof on the housing cover or housing body.

5. The electronics housing according to claim 1, wherein the pull tab has an actuating projection on the end thereof.

6. The electronics housing according to claim 5, wherein the actuating projection is dimensioned such that it allows manual, tool-free gripping in the latched state of the cable.

7. The electronics housing according to claim 1, wherein the pull tab terminates flush with an opening of the cable guide shaft in the housing cover or housing body.

8. The electronics housing according to claim 1, wherein the groove depth of the groove in the cable guide shaft can be varied by mechanical deformation of the pull tab.

9. The electronics housing according to claim 1, wherein the pull tab and the retaining latch are arranged relative to one another in such a way that the retaining latch can be deformed and thus unlatched by the application of a force perpendicular to the insertion direction of the plug connector into the plug connector socket.

10. The electronics housing according to claim 1, wherein the cable guide shaft is arranged in the shape of an arc in the housing cover or housing body for strain relief.

11. The electronics housing according to claim 1, wherein at least the pull tab and preferably the entire housing cover and/or housing body having the pull tab fastened thereto is formed of polycarbonate.

* * * * *